(12) United States Patent
Boutet et al.

(10) Patent No.: US 8,074,349 B2
(45) Date of Patent: Dec. 13, 2011

(54) MAGNETIC HOLD-DOWN FOR FOIL SUBSTRATE PROCESSING

(75) Inventors: John Claude Boutet, Rochester, NY (US); Timothy John Tredwell, Fairport, NY (US)

(73) Assignee: Carestream Health, Inc., Rochester, NY (US)

( * ) Notice: Subject to any disclaimer, the term of this patent is extended or adjusted under 35 U.S.C. 154(b) by 345 days.

(21) Appl. No.: 12/424,605

(22) Filed: Apr. 16, 2009

(65) Prior Publication Data
US 2010/0266810 A1 Oct. 21, 2010

(51) Int. Cl.
*H05K 3/30* (2006.01)
(52) U.S. Cl. ............. 29/831; 29/832; 29/843; 29/846; 29/860; 29/876; 156/247; 156/379.6; 428/138; 428/426; 428/448
(58) Field of Classification Search ............ 29/830–832, 29/835–837, 841, 843, 846, 860, 876, 878, 29/879; 156/247, 379.6; 428/138, 426, 448
See application file for complete search history.

(56) References Cited

U.S. PATENT DOCUMENTS

| | | | | |
|---|---|---|---|---|
| 4,683,653 | A | * | 8/1987 | Iwasa .............................. 29/830 |
| 5,777,402 | A | * | 7/1998 | Chitayat .................... 310/12.06 |
| 6,098,282 | A | * | 8/2000 | Frankeny et al. ............... 29/852 |
| 6,492,201 | B1 | * | 12/2002 | Haba ............................. 438/121 |
| 2008/0026581 | A1 | | 1/2008 | Tredwell et al. |
| 2008/0090338 | A1 | | 4/2008 | Tredwell et al. |

OTHER PUBLICATIONS

Commonly Assigned -U.S. Appl. No. 12/028,182 entitled "Method for Forming an Electronic Device on a Substrate Supported by a Carrier and Resultant Device", filed Feb. 8, 2008, in the name of Roger Kerr et al.
Commonly assigned: U.S. Appl. No. 12/028,194 entitled "Method for Forming an Electronic Device on a Flexible Substrate Supported on a Detachable Carrier", filed Feb. 8, 2008, in the name of Roger Kerr et al.

* cited by examiner

*Primary Examiner* — Paul D Kim

(57) ABSTRACT

A method for forming an electronic circuit disposes a plurality of magnets onto a flux plate to form a magnetic platen. A substrate package is formed using the magnetic platen and, stacked against the magnetic platen, a non-magnetic carrier and a substrate layer, with a bonding material sandwiched between the carrier and the substrate layer, and with the carrier layer disposed nearest the magnetic platen. A fused wafer stack is formed by heating the substrate package to adhere the substrate layer to the carrier. The fused wafer stack is removed from the magnetic platen and the circuit fabricated on the substrate layer.

12 Claims, 15 Drawing Sheets

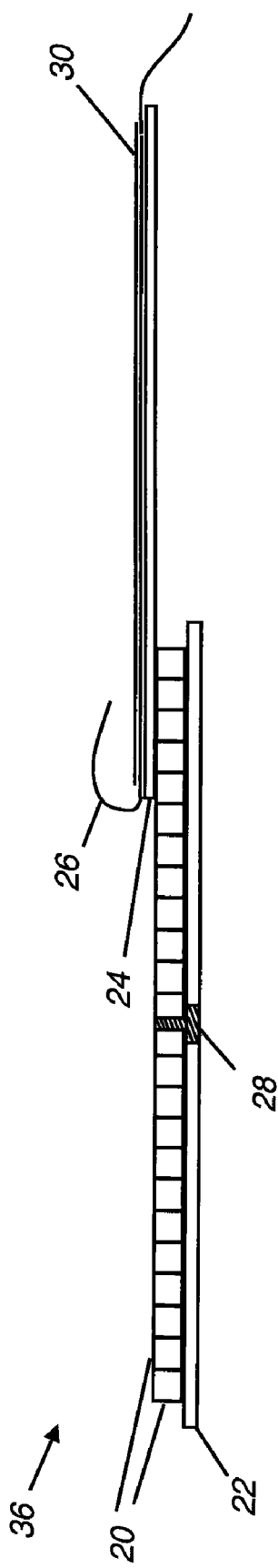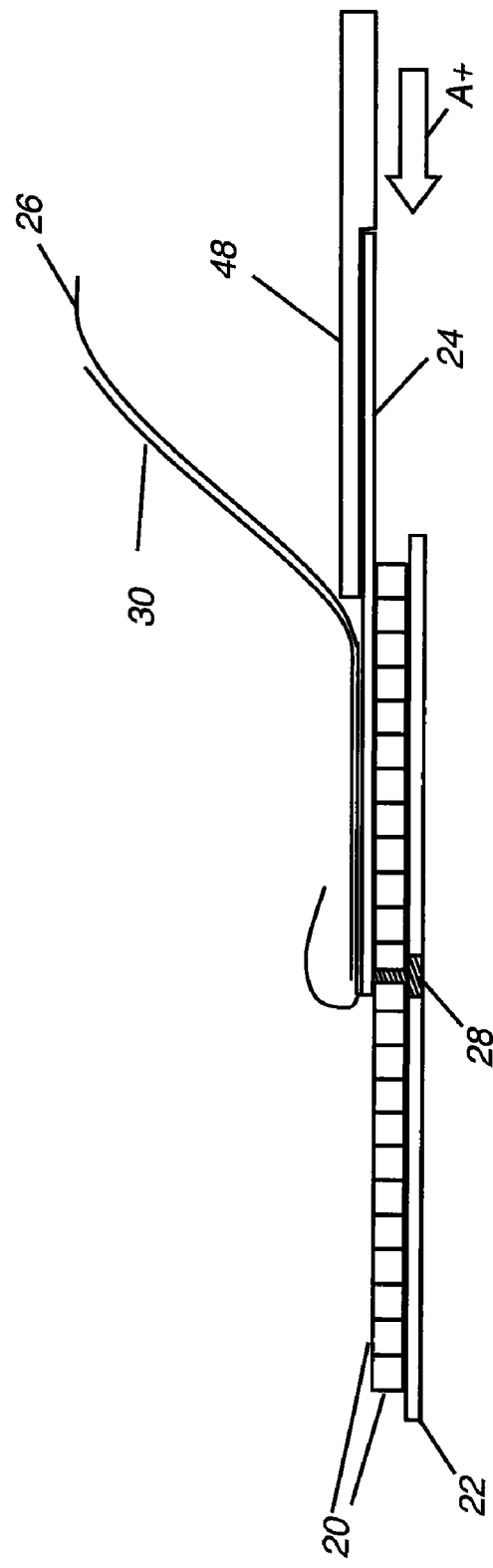

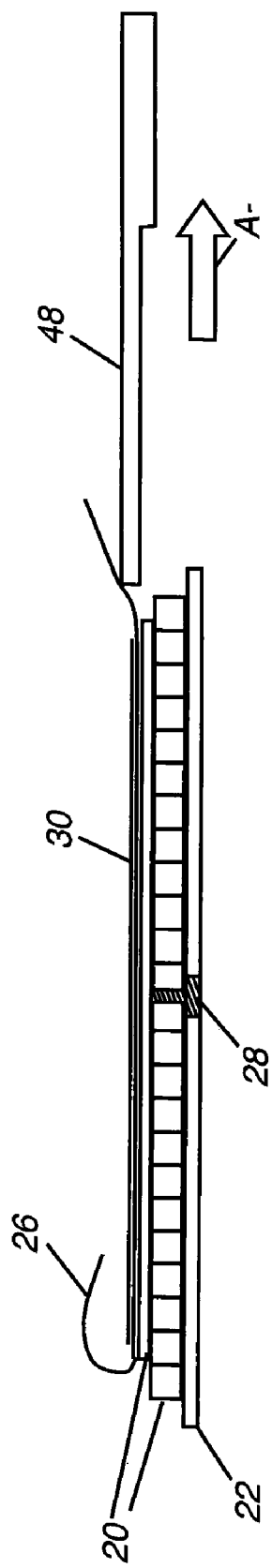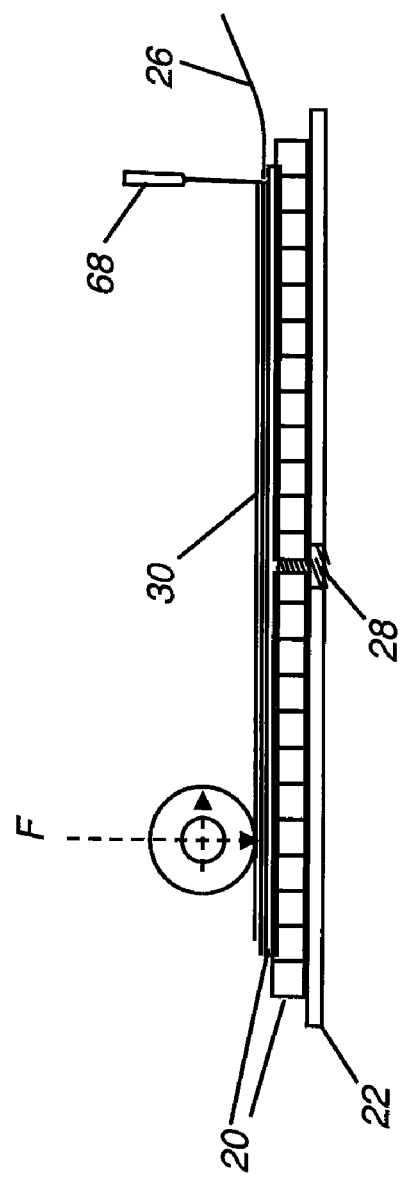

MAGNETIC HOLD-DOWN FOR FOIL SUBSTRATE PROCESSING

FIELD OF THE INVENTION

The invention generally relates to electronic device fabrication and more particularly relates to device fabrication onto a metal foil substrate supported against a glass carrier using magnetic force.

BACKGROUND OF THE INVENTION

Thin-film transistor (TFT) devices are conventionally fabricated on glass or other silicon-based substrates using a sequence of deposition, patterning, and etching steps. For example, amorphous silicon TFT devices require deposition, patterning, and etching of metals, such as aluminum, chromium or molybdenum; of amorphous silicon semiconductors; and of insulators, such as SiO2 or Si3N4, onto a substrate. Fabrication facilities for LCD panels are set up to handle glass substrates that are generally in the 500 to 700 um thickness range. The semiconductor thin film is formed in layers having typical thicknesses ranging from several nanometers (nm) to several hundred nm, with intermediary layers having thicknesses on the order of a few microns. The semiconductor thin film may be formed over an insulating surface that lies atop the rigid substrate.

The requirement for a rigid substrate has been based largely on the demands of the fabrication process itself. Rigidity allows the fabrication system to more accurately register the substrate in position for the different process steps. Thermal characteristics are also particularly important. TFT devices are fabricated at relatively high temperatures, making it difficult to work with many types of plastics and with some metals, due to thermal expansion characteristics. Thus far, the range of substrate materials that have been used successfully is somewhat limited, generally to glass, quartz, or other rigid, silicon-based materials.

For some applications there would be an advantage in fabricating TFT devices on thin metal foils that could provide a thinner and more rugged substrate than glass. Such foils could have thicknesses in the range of 50 to 250 um or greater. One method to accommodate such foils in a glass-based fabrication facility is to laminate the foil substrate to a glass carrier for the fabrication process, then delaminate it for use once fabrication is completed. However, lamination in this manner presents a number of difficulties, for example:

(i) Dimensional instability of the laminated stack of materials over the temperature range. The different materials used for the foil substrate, carrier, and lamination are subjected to a wide range of temperatures during fabrication. In some cases, the total temperature change during various phases of fabrication can be around 250 degrees C. Over this changing temperature range, mismatches of their respective Coefficients of Thermal Expansion (CTE) can cause excessive stress along the interface between the different materials. This applies to the laminated materials themselves as well as to materials used to form the TFT devices. In some cases, this can cause the laminated materials to separate or stretch or can even crack the glass carrier.

(ii) Failure to maintain substrate flatness and position throughout processing. In order lie flat in position against the carrier throughout processing, the laminate material that acts as the adhesive must be applied uniformly between the foil substrate and the carrier and must work well over the complete temperature range. The substrate must be maintained in positional register so that it does not shift relative to the carrier surface during processing. Air pockets must be prevented from forming within the metal foil-glass carrier stack.

(iii) The need for proper preparation and conditioning of the foil surface. TFT fabrication requires that the substrate surface be extremely smooth, with no more than about 50 nm peak-to-peak roughness. Handling and preparatory steps must be performed with this stringent requirement in mind. This includes steps for lamination without damaging the foil surface.

(iv) Delamination without damaging the circuitry, substrate, or carrier. Once fabrication is complete, it is important that the treated substrate be removed from the carrier without stretching, tearing, or otherwise damaging the material or causing stress to the TFT components. It can be further advantageous to be able to re-use the carrier.

(v) Chemical incompatibility of laminated materials. Materials laminated together must be chemically compatible with each other as well as with the chemical processes that are used in TFT circuit fabrication.

(vi) Poor signal handling and isolation with respect to the metal substrate. Planarization and other methods must be used to prevent shorting to the conductive substrate. Other considerations related to signal handling can include capacitive coupling.

If a separate lamination sheet is assembled into the metal and glass wafer stack, it is desirable to easily trim such a lamination sheet to the edge of the metal foil after assembly to the glass and before heating. As can be appreciated, the task of accurately registering a thin precut 12 to 50 um thick plastic lamination sheet to the thin metal wafer is extremely difficult.

In addition to metal foils, there can also be advantages in circuit fabrication onto thin plastic substrates or other non-metallic films. To use such materials, some type of carrier is needed to provide support during fabrication. The same general requirements given earlier in (i)-(v) apply for providing non-metallic substrates on a suitable carrier for TFT fabrication processing.

There is an interest in TFT fabrication onto a metal foil and other substrates using a glass carrier. However, the problems listed above (in (i)-(vi)) present a challenge to efforts for achieving large-scale production fabrication onto metallic or non-metallic foil substrates.

SUMMARY OF THE INVENTION

It is an object of the present invention to advance the art of thin-film circuit fabrication onto thin foil substrates. With this object in mind, the present invention provides a method for forming an electronic circuit comprising: disposing a plurality of magnets onto a flux plate to form a magnetic platen; forming a substrate package comprising the magnetic platen and, stacked against the magnetic platen, a non-magnetic carrier and a substrate layer, with a bonding material sandwiched between the carrier and the substrate layer, and with the carrier layer disposed nearest the magnetic platen; forming a fused wafer stack by heating the substrate package to adhere the substrate layer to the carrier; removing the fused wafer stack from the magnetic platen; and fabricating the circuit on the substrate layer.

It is a feature of the present invention that it uses magnetic attraction for applying a hold-down force for achieving uniform lamination of the metal foil substrate onto the glass carrier. Magnets are disposed to provide a uniform urging force to press the metal foil substrate against a bonding layer and to provide lamination of the substrate to a carrier.

It is an advantage of the present invention that it applies a magnetic urging force to the metal foil substrate, avoiding direct contact with the substrate surface and reducing the likelihood of damage when compressing the substrate against its carrier.

These objects are given only by way of illustrative example, and such objects may be exemplary of one or more embodiments of the invention. Other desirable objectives and advantages inherently achieved by the disclosed invention may occur or become apparent to those skilled in the art. The invention is defined by the appended claims.

BRIEF DESCRIPTION OF THE DRAWINGS

The foregoing and other objects, features, and advantages of the invention will be apparent from the following more particular description of the embodiments of the invention, as illustrated in the accompanying drawings. The elements of the drawings are not necessarily to scale relative to each other.

FIG. 2A is a side view showing an initial step in positioning a registered wafer stack onto a magnetic platen in preparation for fusing.

FIG. 2B is a side view of a procedure for sliding the registered wafer stack fully onto the magnetic platen.

FIG. 2C is a side view showing the wafer stack fully moved onto the magnetic platen.

FIG. 2D is a side view showing trimming and squeegee processes for preparing a substrate package for fusing.

DETAILED DESCRIPTION OF THE INVENTION

Figure 1A:
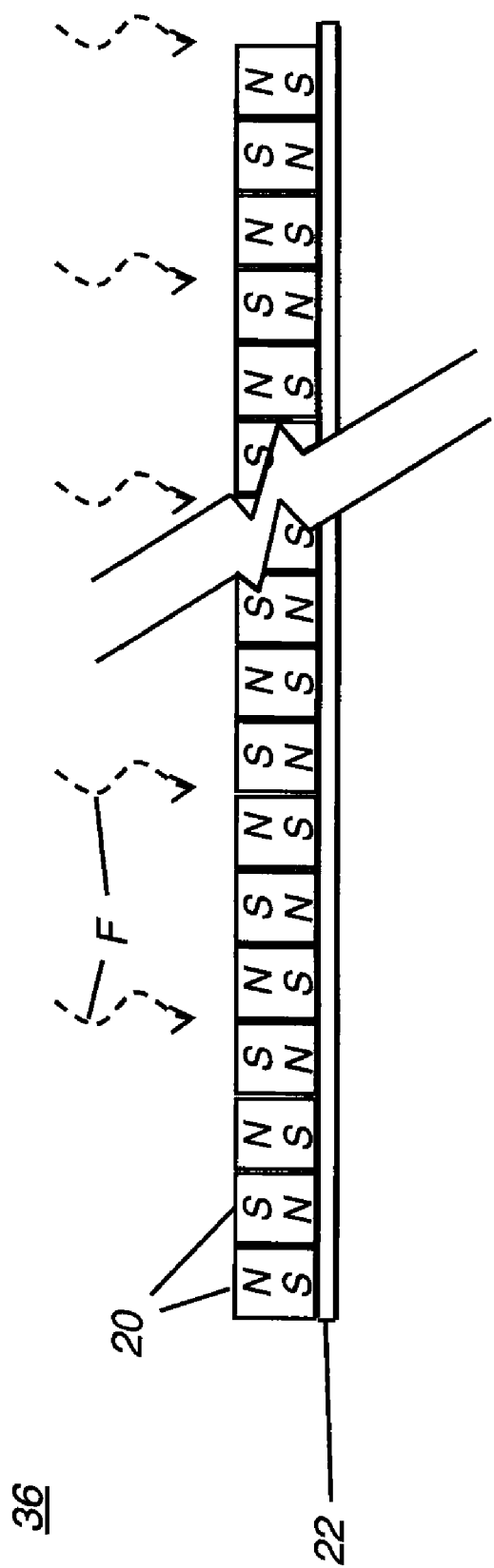
FIG. 1A shows a cross-sectional side view of a bed of magnets forming a magnetic platen in one embodiment of the present invention.

The following is a detailed description of the preferred embodiments of the invention, reference being made to the drawings in which the same reference numerals identify the same elements of structure in each of the several figures.

Reference is made to U.S. Publication No. 2008-0090338 entitled "Flexible Substrate with Electronic Devices and Traces" filed on Oct. 3, 2006, in the name of Timothy J. Tredwell et al.

Reference is made to U.S. Publication No. 2008-0026581 entitled "Flexible Substrate With Electronic Devices Formed Thereon" filed on Jul. 31, 2006, in the name of Timothy J. Tredwell et al.

Reference is made to U.S. patent application Ser. No. 12/028,194 entitled "Method For Forming An Electronic Device On A Flexible Substrate Supported On A Detachable Carrier", filed on Feb. 8, 2008, in the name of Roger Kerr et al.

Reference is made to U.S. patent application Ser. No. 12/028,182 entitled "Method For Forming An Electronic Device On A Substrate Supported By A Carrier And Resultant Device", filed on Feb. 8, 2008, in the name of Roger Kerr et al.

Terms such as "top", "atop", "beneath", and "bottom" are used to describe the relative position of different layers of materials or components and are not intended to imply a particular vertical relationship relative to gravity. There may be some embodiments or steps within one or more embodiments wherein it is advantageous to stack components onto others by adding them from below or from the side, for example.

In the context of the present disclosure, a "magnetic material" or material having high permeability has a relative magnetic permeability that is at least 50 or more times that of vacuum, at 1 kHz. A non-magnetic material has a permeability that is closer to that of vacuum (with a relative permeability value of 1.00) or air. Some examples of non-magnetic materials include glass and plastics, and metals such as copper (relative permeability 0.99), silver (0.99) and aluminum (0.99).

In the context of the present invention, a "foil substrate" has a thickness of less than 0.020 inches and may be metallic or non-metallic. The foil substrate may have high magnetic permeability or may have little or effectively no magnetic permeability.

The apparatus and methods of the present invention are used in preparing a metal foil or other thin substrate for fabrication of thin-film transistor (TFT) and related electronic circuitry or other semiconductor fabrication applications. The initial portion of this detailed description is directed primarily to preparation of metal foil substrates. Later portions of this detailed description then give information and procedures that apply for embodiments using other thin substrate materials.

Embodiments of the present invention provide a laminated, mounted, process-ready substrate package, in which the metal foil substrate is temporarily bonded to a rigid carrier so that it can be processed successfully, accepting patterned layers of semiconductor material for forming an electronic circuit having microcircuit devices. Magnetic attraction is used as a hold-down mechanism during preparation and during lamination fusing, enabling the metal foil substrate to be securely retained in place against the carrier, under a substantially uniform force over its area, and without the need for surface handling or contact.

Embodiments of the present invention form a magnetic platen, using an array of magnets that form a magnetic bed or using some other type of magnetized element. The magnetic platen maintains a continuous attractive force between a metallic foil substrate and the magnetic bed or platen, thereby providing a clamping force to a carrier in preparation for a thermal bonding cycle. A heat-actuated adhesive material is sandwiched between the substrate and carrier. The thermal bonding cycle then bonds the foil substrate to the carrier, while the substrate package is held in place by the magnetic bed or platen.

The sequence of FIGS. 1A-1F shows a succession of steps for preparing a laminated substrate package 40 in one embodiment of the present invention. A brief overview of each step is given first; more detailed information on materials, conditions, dimensions, and optional processes are then provided in subsequent description.

Overview of Process Steps

Figure 1B:
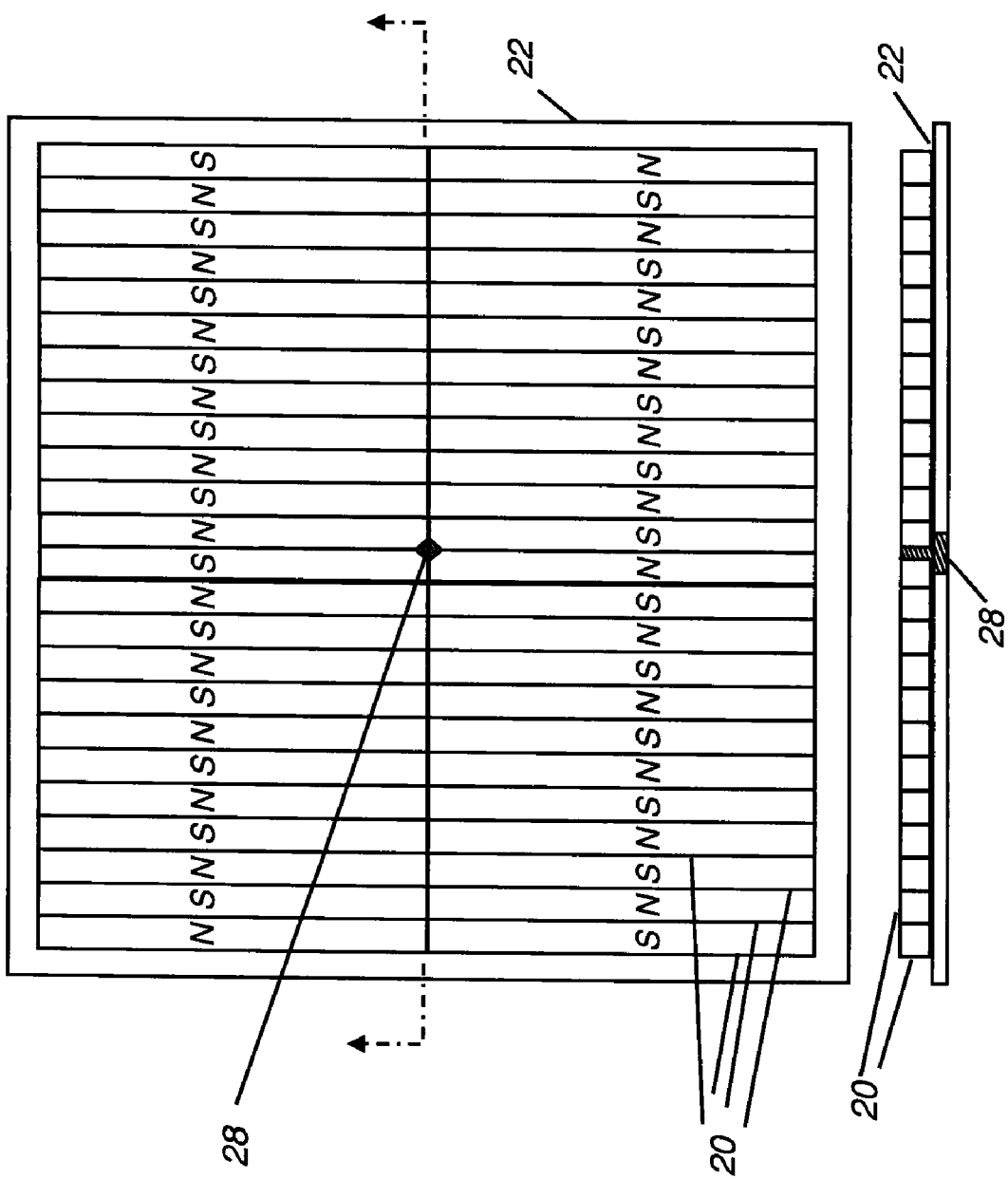
FIG. 1B shows a top and side view of a magnetic platen as shown in FIG. 1A.

FIG. 1A shows an initial step in which an arrangement of magnets 20 is arrayed onto a flux plate 22 to form a magnetic platen 36 as a bed of magnets 20. The top view of FIG. 1B shows one exemplary arrangement of magnets 20 on flux plate 22. Magnets 20 in magnetic platen 36 are spaced closely together as shown in order to provide a substantially uniform area of attraction with a magnetic force F. Magnetic poles for adjacent magnets alternate, as shown in FIGS. 1A and 1B. The attraction of the magnets to flux plate 22 and to each other holds magnetic platen 36 together. The top and side views in FIG. 1B also show the position of an air hole 28 used to provide a countering force to magnets 20 for positioning purposes, as described in more detail subsequently. The needed pole spacing between magnets 20 is a function of the strength of the magnets, the thickness of the glass carrier applied in a subsequent step (FIG. 1C) and the permeability of the foil substrate that is used, also applied in a subsequent step (FIG. 1E).

Figure 1C:
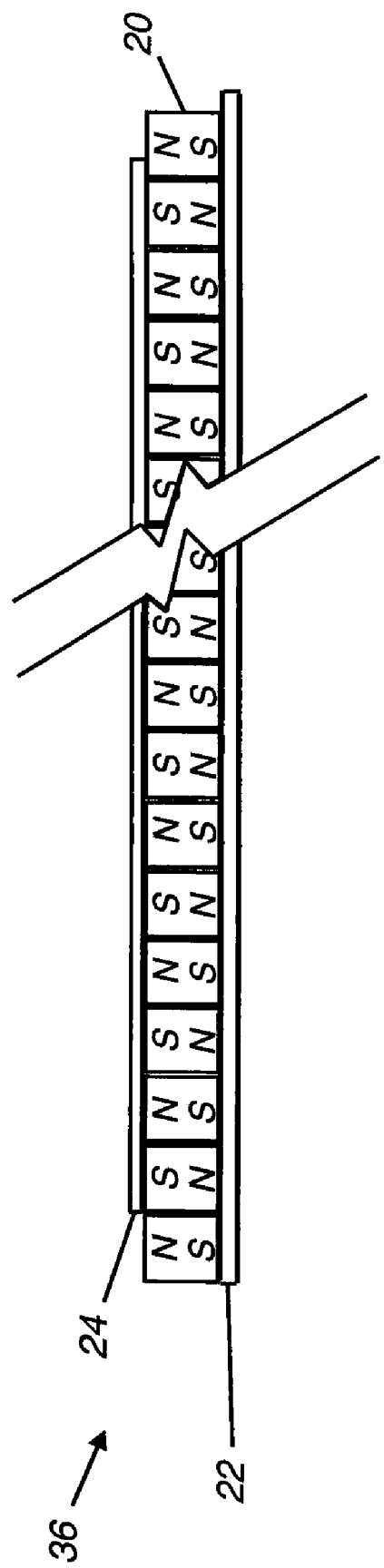
FIG. 1C is a cross-sectional side view showing a carrier positioned against the magnetic platen.

In FIG. 1C, a glass carrier 24 is positioned atop the magnetic platen 36. The thickness of glass carrier 24 is selected for compatibility with the fabrication method and apparatus that will be used for processing the completed substrate package.

Figure 1D:
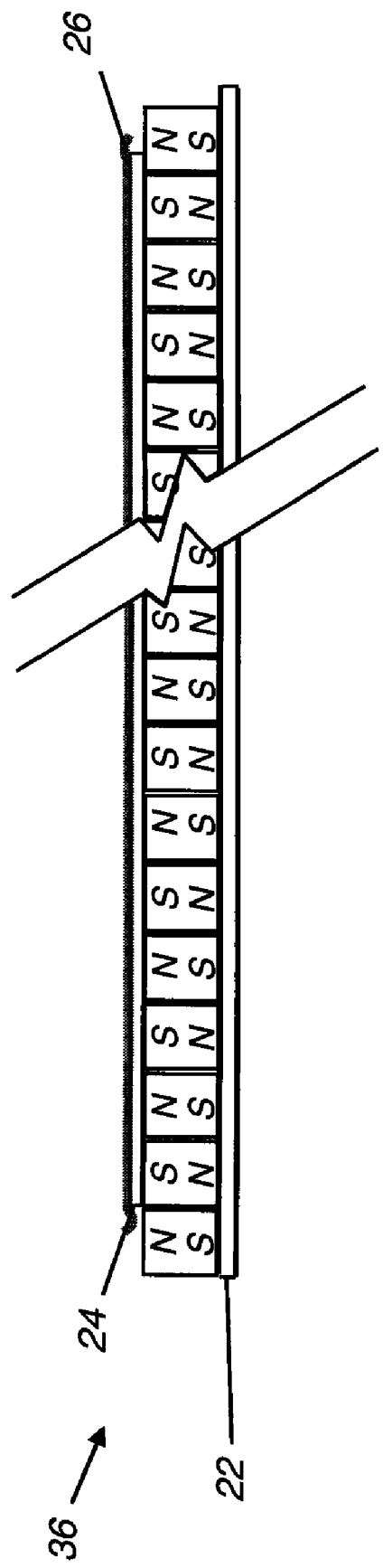
FIG. 1D is a cross-sectional side view showing a bonding layer applied atop the carrier.
Figure 1E:
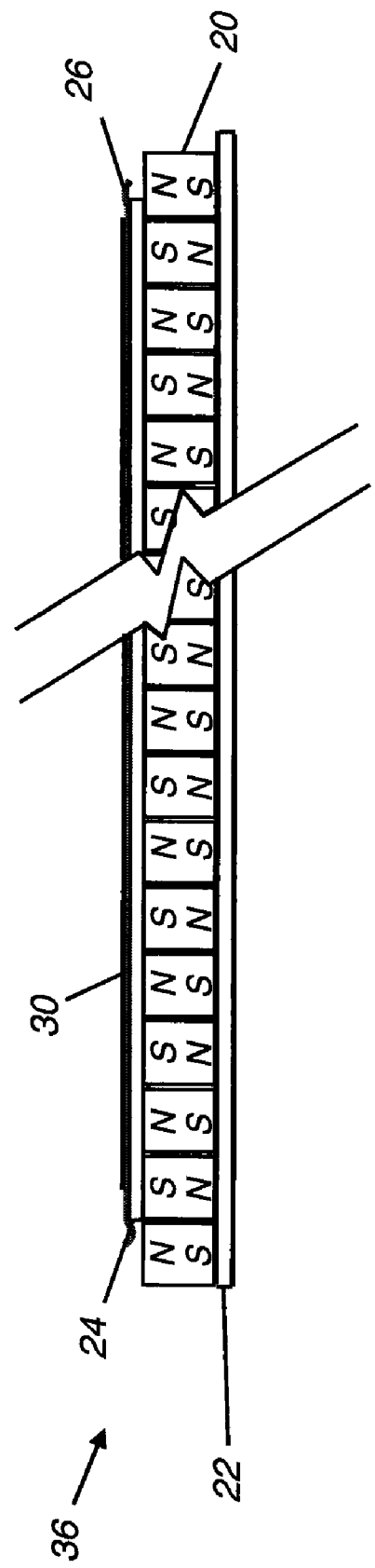
FIG. 1E is a cross-sectional side view showing a metallic foil carrier applied atop the bonding layer, prior to bonding layer trimming and lamination fusing.

In FIG. 1D, a bonding layer 26 is applied against the top surface of glass carrier 24. In the embodiment of FIGS. 1D and 1E, bonding layer 26 is shown provided in sheet form, one of a number of possible embodiments. FIG. 1E then shows a metal foil substrate 30 applied on top of bonding layer 26.

Figure 1F:
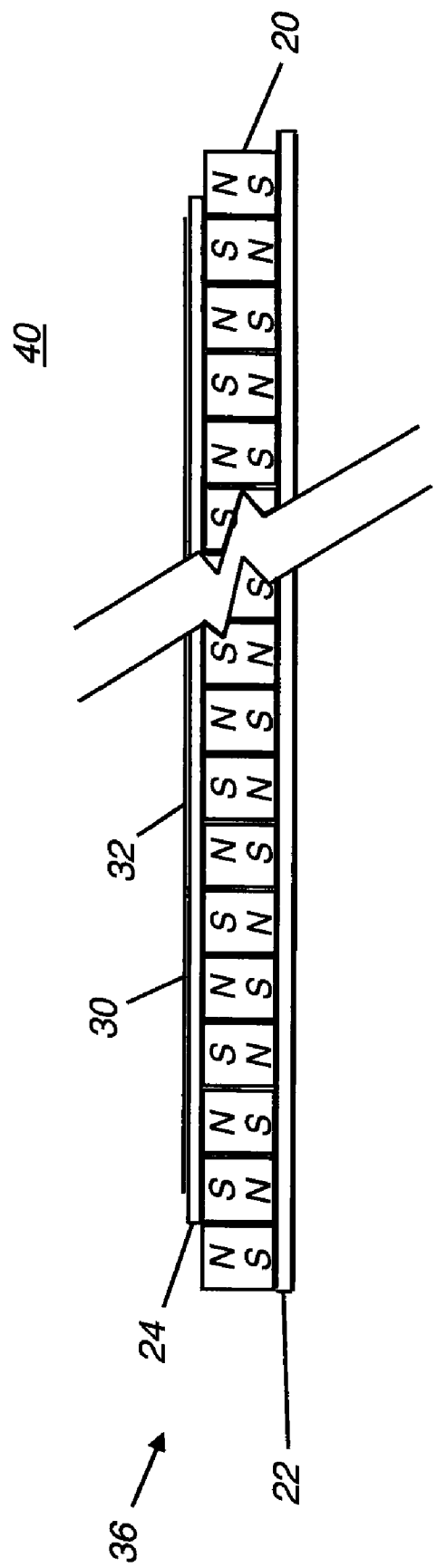
FIG. 1F is a cross-sectional side view showing a metallic foil carrier fused to the carrier to form a fused wafer stack.

A number of final preparation steps follow for readying laminated substrate package for fusing in the oven. With the sandwiched materials in the arrangement of FIG. 1E, excess portions of bonding layer 26 can be trimmed from the perimeter of substrate 30. This provides the trimmed arrangement of substrate package 40 that is shown in FIG. 1F. Prior to or following this trimming operation, pressure can be applied to provide full contact with bonding layer 26. In the manner of a "squeegee", a roller or a blade or other flat tool (not shown in FIG. 1F) can then be drawn across a substrate surface 32 of substrate 30 in order to squeeze any air pockets out from between carrier 24 and substrate 30. In subsequent processing, the constant magnetic clamping force on the foil helps prevent air from working back into the stack once it is forced out. Additional steps of dirt removal and defect detection can then be executed, as needed, prior to or following fusing.

The fusing step for lamination follows these final preparation stages. The temperatures and time duration needed depend on factors such as materials used and thickness dimensions. In one embodiment, lamination fusing was performed in an oven at 277 degrees C. for 20 to 30 minutes.

Figure 1G:
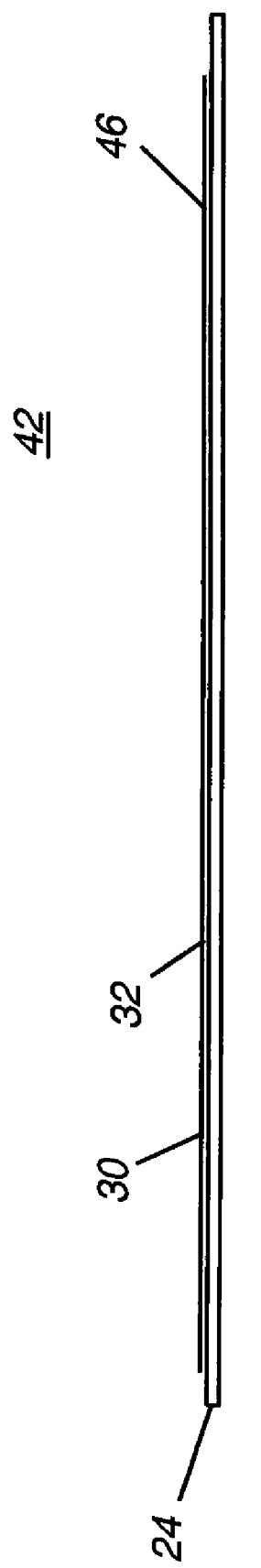
FIG. 1G is a cross-sectional side view showing a fused wafer stack with an electronic circuit formed thereon.

After fusing, it is desired to remove the top portion of substrate package 40, with substrate 30 bonded to carrier 24 forming a fused wafer stack 42, as shown in FIG. 1G. Subsequent description is provided for one way to do this.

The resulting fused wafer stack 42 can then be subjected to additional processing in order to prepare substrate surface 32 for an electronic circuit 46 to be formed thereon. A layer of planarization material is typically used for final surface preparation, along with additional layers that provide insulation or other features. TFT fabrication is then performed, in which successive patterned layers are overlaid in order to form the microcircuitry of the TFT device.

Using the process just described, fused wafer stack 42, with metal foil substrate 30 bonded to its carrier 24, can have a thickness profile that is compatible with existing wafers used for conventional TFT processing equipment. For example, fabrication facilities for LCD panels currently handle glass substrates that are generally in the 500 to 700 um thickness range. As one example, using 5 mil (127 um) foil substrate 30 in combination with 500 um Eagle 2000 glass as carrier 24 and a 1 mil (25 um) thick FEP bonding sheet as bonding layer 26 yields fused wafer stack 42 as a laminated stack that is approximately 652 um thick. This is in the focusing range of conventional TFT fabrication equipment, typically set up for using 675 to 700 um glass used in many facilities.

Following component fabrication, delamination is performed, in which metal foil substrate 30 is removed from carrier 24. The method used depends on the type of adhesive used for bonding layer 26 and on the relative tenacity of the bond that is formed. For some adhesives, a razor or similar edged tool can be employed in order to initiate substrate 30 removal by lifting it away from carrier 24. Manual or mechanical peeling is then used to complete the delamination. Where the bond may be too strong to allow peeling at room temperature, heat can be used to soften the adhesive, with a skiving blade or similar tool used to separate foil substrate 30 from carrier 24. However, this method can leave some residue on either or both substrate 30 and carrier 24. It is advantageous to have the adhesive remain only on the carrier or only on the substrate, and if on the substrate, for the adhesive to be smooth.

The task of assembling substrate package 40 of FIG. 1F while maintaining the required cleanliness and accuracy can be accomplished in a number of ways. In one embodiment, assembly steps for initially layering the different sheet materials begin by placing bonding layer 26 onto substrate 30. Carrier 24 is then placed on top of this assembly, which can be flipped over and slid into position across magnetic platen 36. Alternate approaches to the assembly problem, familiar to those skilled in the fabrication assembly arts, could also be used.

FIGS. 2A-2D illustrate steps used in a manual assembly method for forming substrate package 40 in one embodiment. For this embodiment, bonding layer 26 is a thermoplastic in sheet form, initially oversized so that it can be subsequently trimmed. In FIG. 2A, the stack of materials shown in FIG. 1E is assembled and registered, with bonding layer 26 sandwiched between carrier 24 and foil substrate 30. In FIG. 2B, a push tool 48 is used to push this stack of materials onto the magnetic platen 36, in the direction of arrow A+. Here, bonding layer 26 and substrate 30 are lifted upwards to allow clearance for tool 48. Push tool 48 advantageously keeps substrate 30 lifted away from magnetic platen 36 as the stack of materials is slid onto this structure. This helps to reduce the amount of drag on the stack of materials as it is slid forward.

Continuing with this sequence, FIG. 2C shows push tool 48 removed, in the direction of arrow A−. Substrate 30 rolls progressively back against carrier 24 as push tool 48 is moved away. This helps to more tightly contain bonding layer 26. In addition, friction between the edge of the withdrawing push tool 48 and bonding layer 26 helps to draw bonding layer 26 tightly in place across carrier 24, reducing the likelihood of folds that might otherwise be clamped down between foil substrate 30 and carrier 24.

In FIG. 2D, a squeegee device then applies a uniform force F across the substrate 30 surface to force out any small air pockets. A blade 68 is used to trim excess border material from bonding layer 26. This completes preparation of substrate package 40, as was shown in FIG. 1F.

Air Release Embodiment

The method described with regard to FIGS. 2A-2D works well for positioning smaller substrates onto the magnetic bed. However, as the substrate package scales upward in size, sliding carrier 24 with its assembled stack across the surface of magnetic platen 36 becomes increasingly more difficult. Similarly, removing fused wafer stack 42 is also more challenging.

Figure 3:
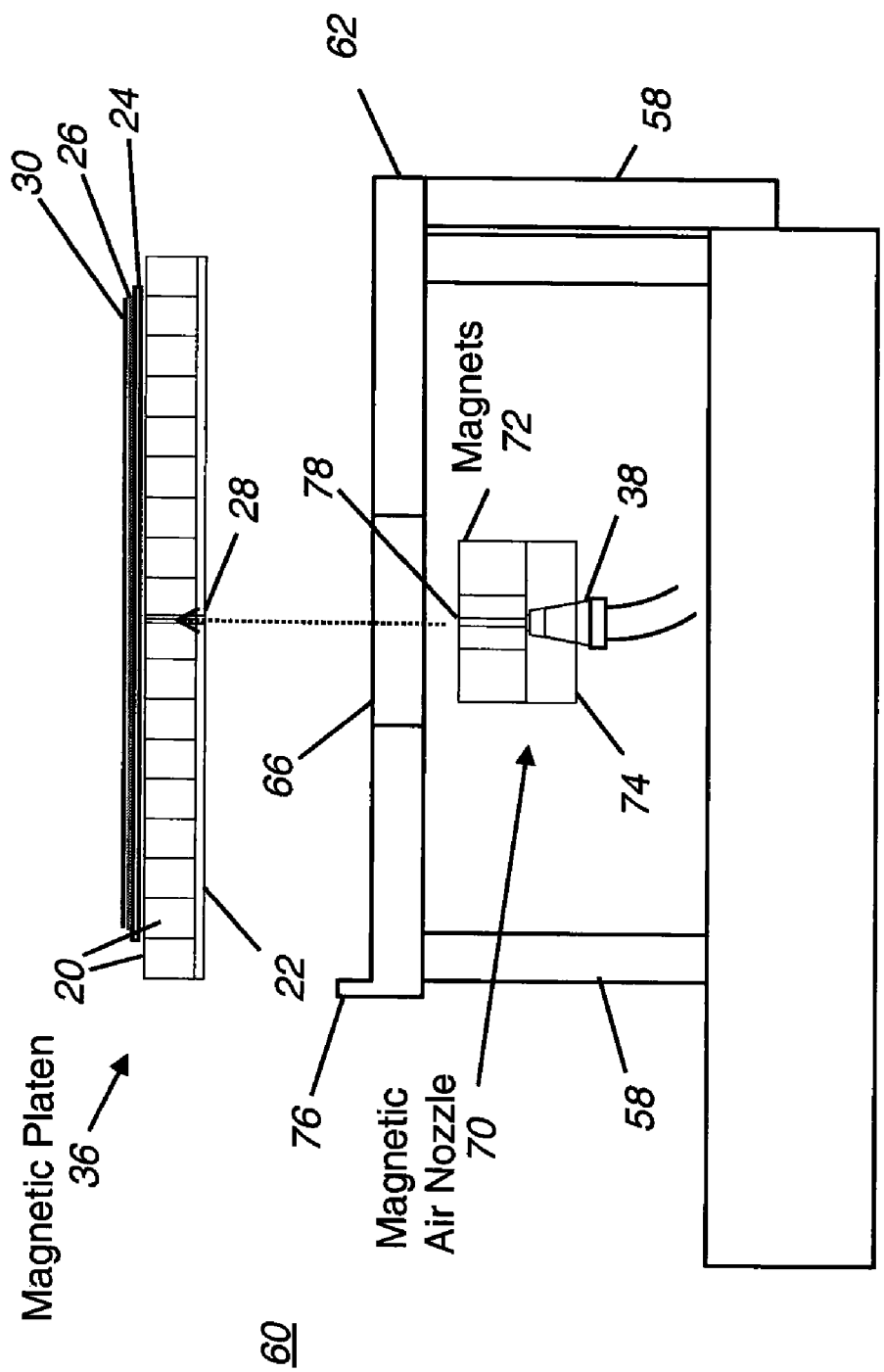
FIG. 3 is a cross-sectional side view showing the use of a compressed air supply to assist removal of the fused wafer stack from the magnetic platen.

To address this, a reverse force can be provided using air pressure to counter the magnetic force for loading and unloading carrier 24. The side view diagram of FIG. 3 shows an alternate embodiment for forming substrate package 40 using air release. An air flotation fixture 60 provides a table 62 on standoffs 58 and a cutout 66 as a support fixture, allowing clearance for connecting a magnetic air nozzle apparatus 70 to port 28. Air nozzle apparatus 70 has a magnetic coupling with magnets 72 and a flux plate 74 disposed around a nozzle 38 for providing air pressure through a port 78. When air nozzle apparatus 70 is held in position and in register against flux plate 22, a port 78 aligns with port 28 on magnetic platen 36. When the air flow is actuated, nozzle 38 can then provide air pressure in an upward direction against the underside of carrier 24, as shown by the dotted-line arrow in FIG. 3, thereby providing an air bearing between carrier 24 and magnetic platen 36 to reduce friction caused by the attractive force of magnets 20, to allow movement of carrier 24 and its assembled or fused stack. An arrangement of seals, such as O-rings and other components, is used to help provide sufficient sealing of the air flow within and from air nozzle apparatus 70. An edge stop 76 is provided for positioning magnetic platen 36 and for allowing removal of the fused wafer stack after heating.

Figure 4:
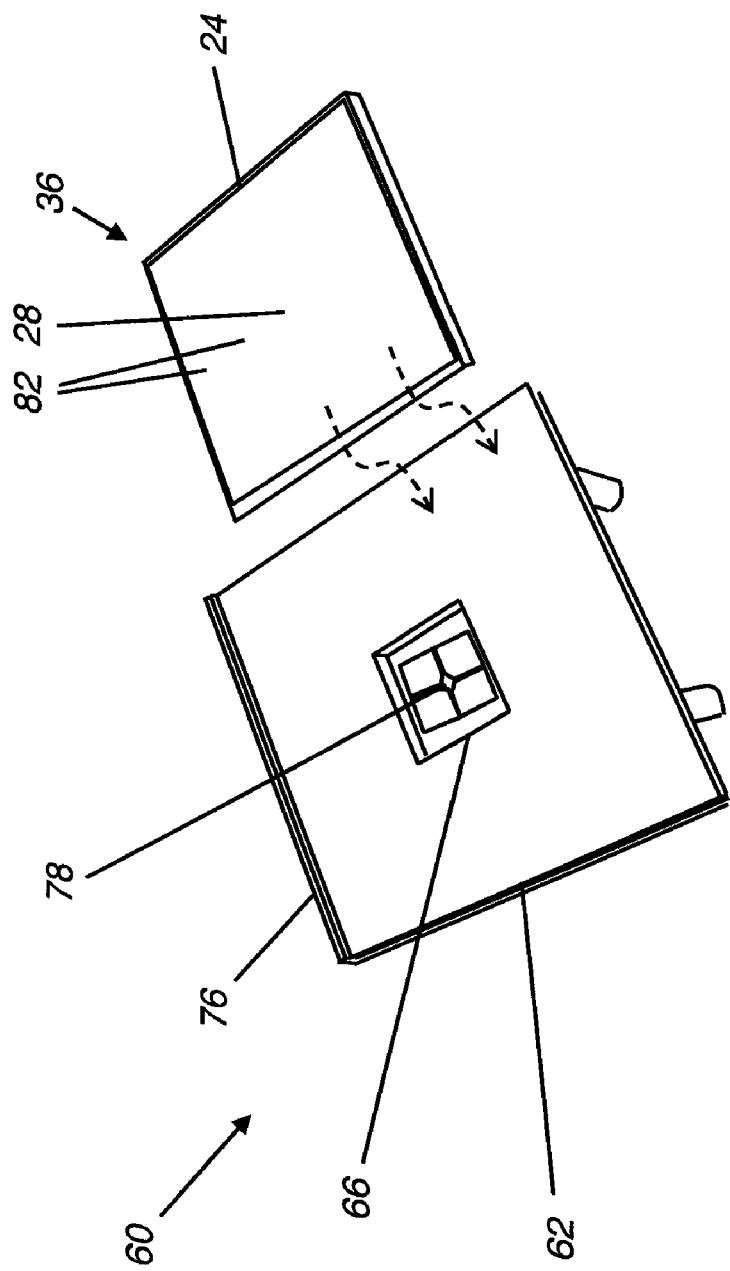
FIG. 4 is a perspective view of an air flotation fixture according to one embodiment of the present invention.

The perspective view of FIG. 4 shows components of air flotation fixture 60, with magnetic platen 36 shown to the right. In addition to port 28, carrier 24 may include auxiliary air holes 82 as shown, for helping to provide added "air-bearing" support for unloading fused wafer stack 42.

Figure 5A:
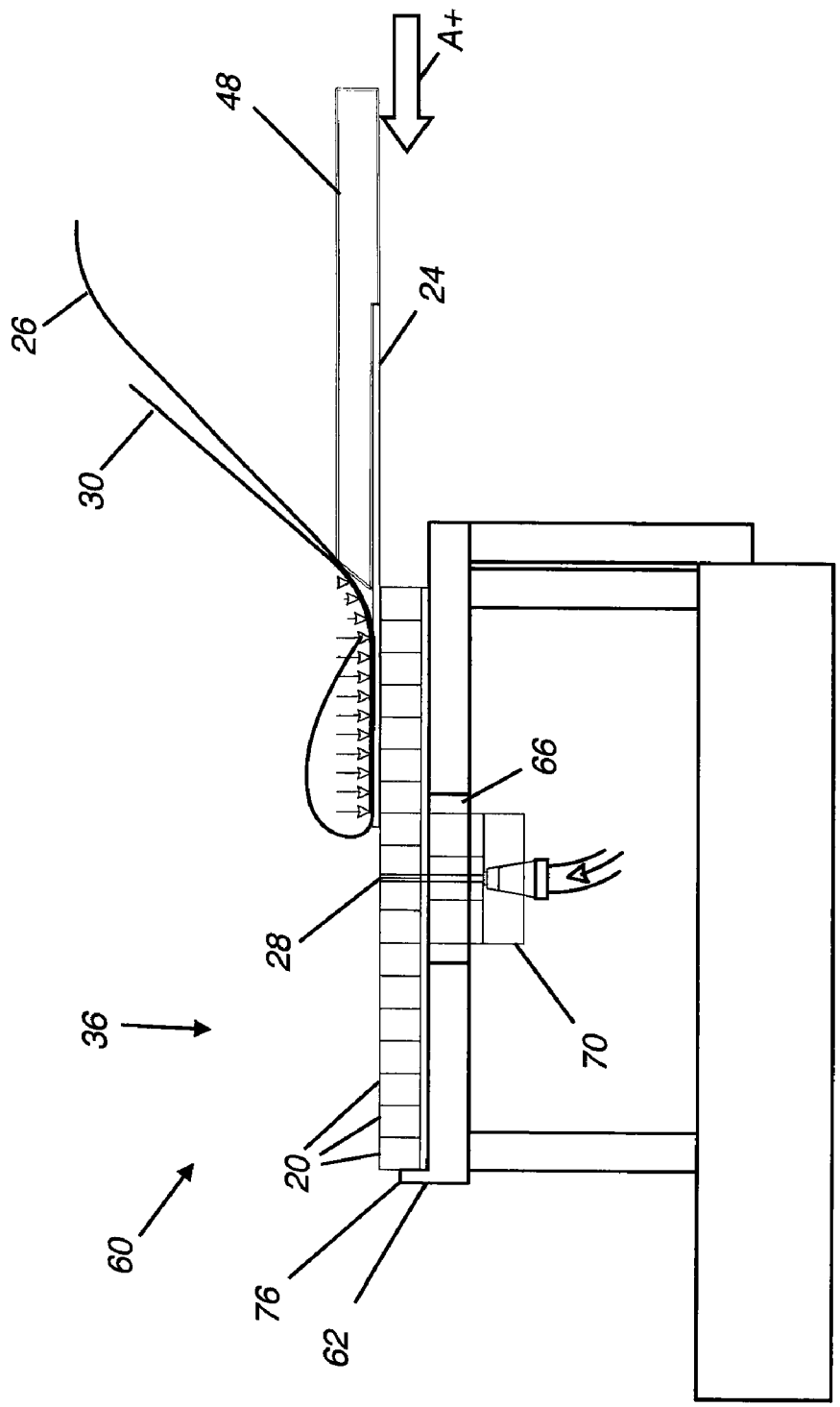
FIG. 5A is a cross-sectional side view showing initial stages of placement for positioning a wafer stack onto a magnetic platen, using an air flotation fixture, in preparation for fusing.
Figure 5B:
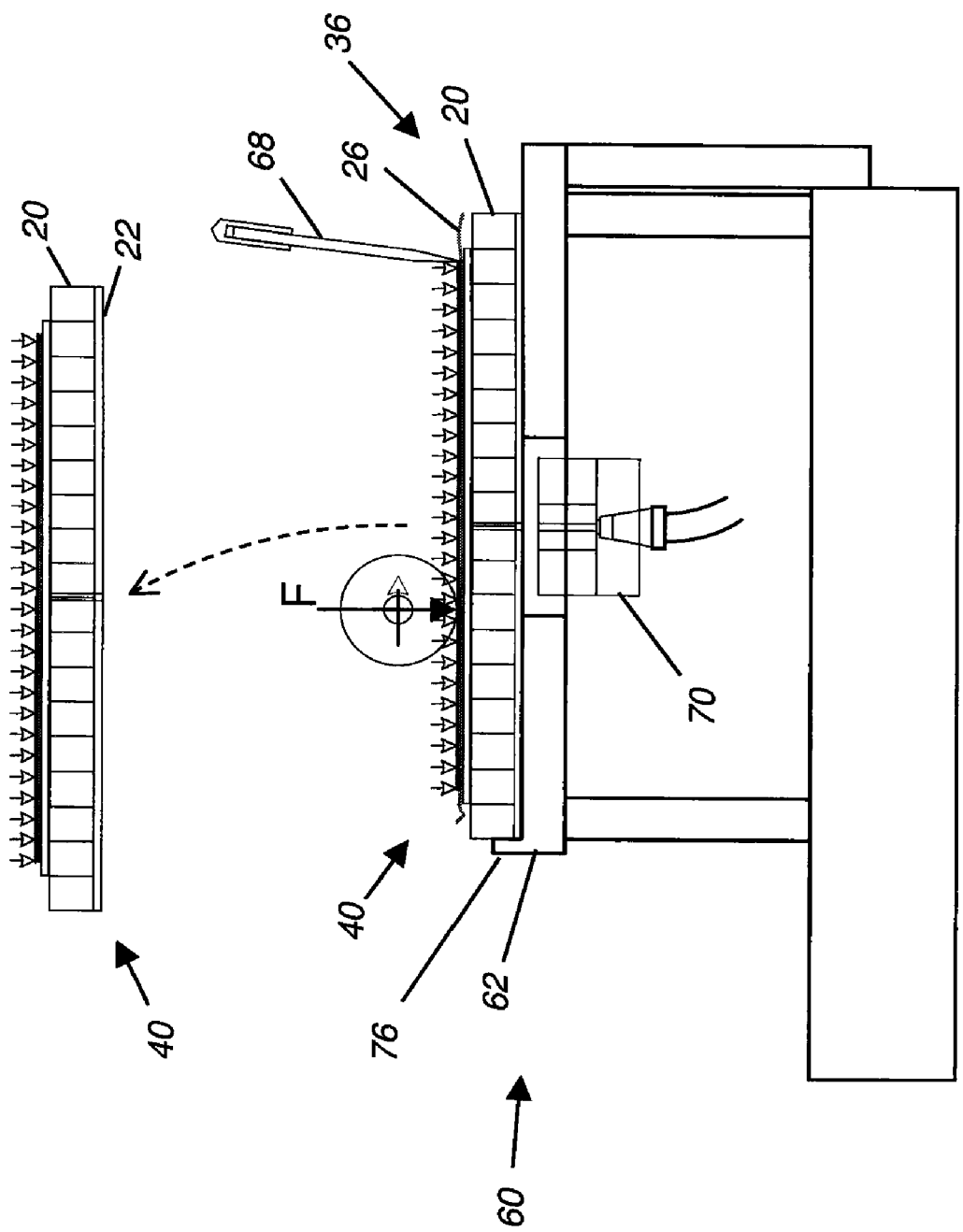
FIG. 5B is a cross-sectional side view showing the wafer stack fully moved onto the magnetic platen.
Figure 5C:
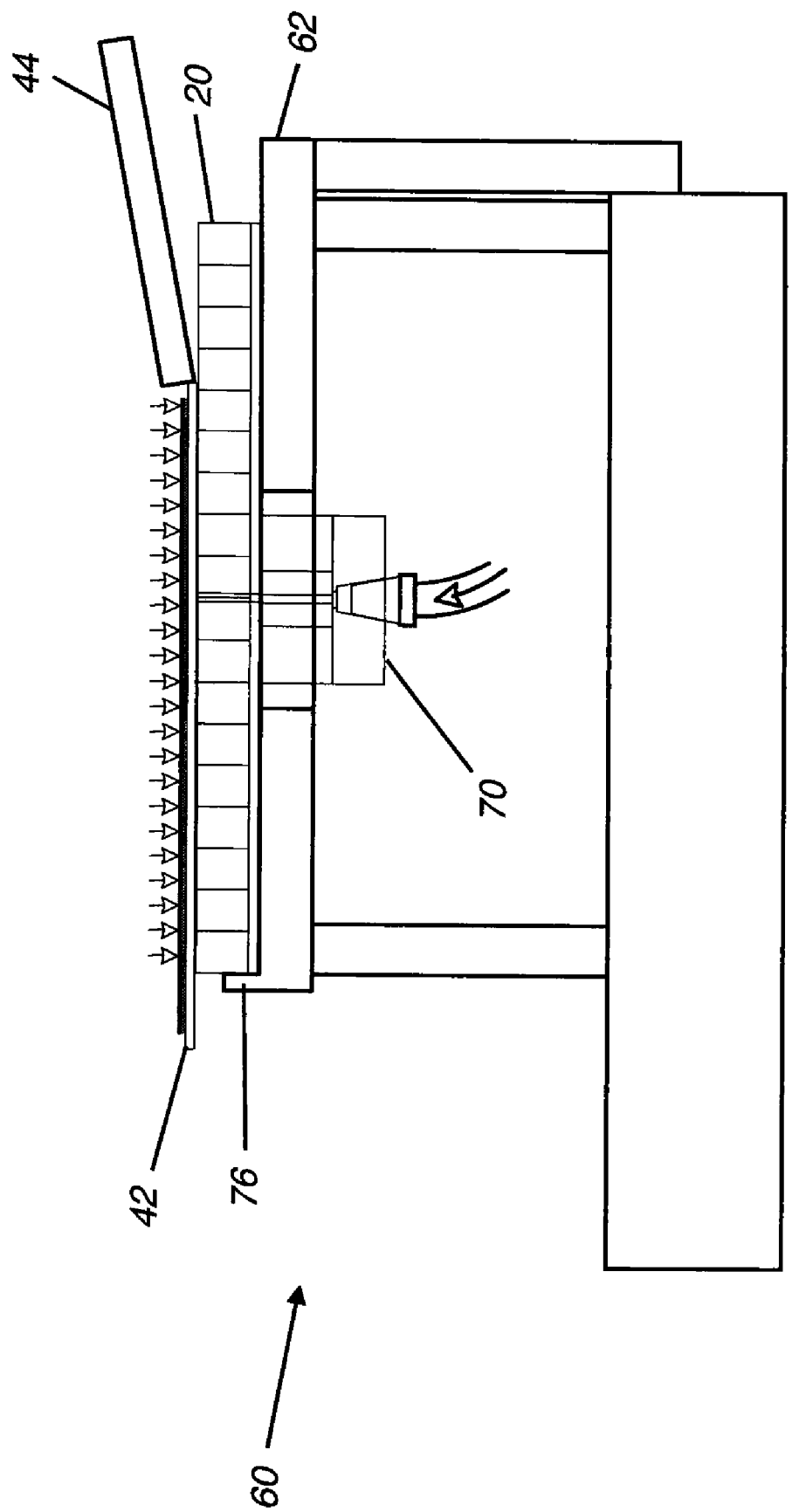
FIG. 5C is a cross-sectional side view showing removal of the fused wafer stack using an air flotation fixture.

The sequence shown in FIGS. 5A-5C shows how air flotation fixture 60 supports loading and unloading of carrier 24 and its stacked layers in one embodiment. In FIG. 5A, the stack of materials shown earlier in FIG. 1E is assembled with bonding layer 26 sandwiched between carrier 24 and foil substrate 30 and fed a short distance onto magnetic platen 36 to establish a clamping force that keeps carrier 24, bonding layer 26, and substrate 30 in register. Air flow is provided from air nozzle apparatus 70 in order to keep friction low between carrier 24 and magnetic platen 36. Non-magnetic push tool 48 is used to push this stack of materials onto magnetic platen 36, in the direction of arrow A+. Bonding layer 26 and substrate 30 are lifted upwards to allow clearance for tool 48. Once carrier 24 is fully slid onto magnetic platen 36, air nozzle apparatus 70 is turned off, push tool 48 is withdrawn and substrate 30 and bonding layer 26 are progressively lowered onto the surface of carrier 24, in a manner similar to that described earlier with reference to FIG. 2C.

The side view of FIG. 5B shows the trimming and squeegee operations performed in order to prepare substrate package 40 for fusing, as was described earlier with reference to FIG. 2D. Magnetic platen 36 and flux plate 22 are used to retain wafer stack 42 clamped in place throughout the fusing cycle.

The side view of FIG. 5C shows removal of fused wafer stack 42 from magnetic platen 36 following the fusing process. To do this, substrate package 40 is placed back onto air flotation fixture 60 and air nozzle apparatus 70 is re-attached. Air pressure is then applied and a tool 44 is used to slide fused wafer stack 42 across and off magnetic platen 36. Edge stop 76 helps to retain magnetic platen 36 as fused wafer stack 42 is removed.

Magnets 20

As can be seen from the process description of FIGS. 1A-1F, the use of a magnet array to form magnetic platen 36 provides a uniform clamping force without the need for mechanical contact with substrate surface 32. This can reduce the likelihood of surface damage and of dirt contamination. The magnetic bed provides a uniform clamping force over a large area without the need for precise clamping jaw alignment, as would be needed in a press, for example.

There are also temperature-related advantages to the use of magnets 20. The assembled wafer stack of substrate package 40, including its magnetic platen, can be inserted "cold", directly into a hot oven for fusing without requiring any heat pre-conditioning. Following fusing, it can be removed when still hot and set aside to cool with the magnetic platen continuously holding the stack clamped until it has cooled down and the wafer stack is removed from the magnetic platen. Further, eliminating the need for a top clamping member in this way reduces the thermal mass that must be heated and cooled.

Magnets 20 can be of any type suitable for the fabrication process and temperatures, including sintered alnico, cast alnico, samarium cobalt (SmCo), Neodymium Iron Boron (NdFeB), and ceramic types, for example. Magnets of different types can be used in the array, such as interspersing stronger with weaker magnets to reduce the overall hold-down force. Magnet shape can be linear as shown in FIG. 1B or, depending on the needed pole-to-pole spacing, square, hexagonal, or some other shape.

As noted above, some factors are considered in order to determine proper pole-to-pole spacing between magnets 20 used to form magnetic platen 36. For example, for use with 500 um glass, magnets that are ¼" thick and ⅛ inch to ¼ inch wide by 1 inch or longer provide good clamping force when assembled on a 0.060" thick steel flux plate, clamping force sufficient to hold substrate 30 of 0.005 inch metallic foil, such as alloy 42, a nickel-iron alloy with a coefficient of thermal expansion (CTE) compatible with that of glass. There can be practical considerations based on magnet fabrication and dimensioning. For example, use of a square magnet, where width equals length, would be advantageous for clamping force and placement. However, the assembly and grinding process for the magnet bed favors increasing length to the longest length practical. This allows grinding forces to be exerted in the length direction, reducing the possibility of tipping magnets attached to flux plate 22.

In an alternate embodiment, magnetic platen 36, described and shown herein primarily as a bed of magnets 20, can instead be formed as a monolithic unit by magnetizing a plate of a magnetic material. For such an embodiment, magnetic platen 36 could be used with or without an added flux plate.

Flux Plate 22

Flux plate 22 is a plate of a high permeability material, such as steel with a corrosion-resistant nickel plating, for example. Various types of steel can be used for flux plate 22. Prior to the operations of being ground flat and plated, the steel should be stress-relieved in order to help minimize distortion during heating cycles.

Carrier 24

In one embodiment, carrier 24 is Eagle 2000 glass. Other types of glass or other materials can be used. CTE values are one important consideration in selection of a suitable carrier 24 material.

Bonding Layer 26

In one embodiment, a thermoplastic bonding material is used for bonding layer 26. Thermoplastic material permits using heat to soften the adhesive to eventually separate the metal and glass; however, the softening point for separation in a later step must be above the device fabrication temperatures. Heating to the softening point for separation is likely to leave a rough surface on both the glass and metal faces as the adhesive material softens and tears apart.

FEP (fluorinated ethylene propylene) is a melt-processible film, commercially available as a Teflon® film from DuPont, and used as bonding layer 26 in an embodiment of the present invention. It can be appreciated that a sheet material such as FEP film has advantages for providing the three-layer arrangement used for fusing in substrate package 40 that is formed on magnetic platen 36 (FIG. 1F). Liquid or particulate bonding materials could alternately be used, applied to substrate 30 or carrier 24, or to both, and solidified to form a uniform layer prior to fusing. A coated bonding material can be applied by any of a number of methods, including spray-coating, knife-coating, coating using distribution from a hopper or other container, or inkjet printing, for example.

In an alternate embodiment, bonding layer 26 is a thermoset material. This has the advantage of permitting heat levels at temperatures above the initial lamination temperature during the device fabrication, but may not easily permit using heat to eventually cause foil separation from the glass carrier.

Whether thermoset or thermoplastic bonding material is used, it is preferable for the adhesive to have a low enough bond strength to either glass or metal that it permits peeling delamination at room temperature, leaving a smooth surface on the back of the metal foil. At the same time, the bonding material of bonding layer 26 must provide sufficient adhesion for maintaining stability during processing and must be able to withstand processing temperatures used for electronic device fabrication.

A range of alternate bonding materials can be used. These can include heat-stabilized polyethylene terephthalate (HS-PET), polyethylenenapthalate (PEN), polycarbonate (PC), polyarylate (PAR), polyetherimide (PEI), polyethersulphone (PES), polyimide (PI) including Kapton®, Teflon® poly(perfluoro-alboxy)fluoropolymer (PFA), poly(ether ether ketone) (PEEK), poly(ether ketone) (PEK), poly(ethylene tetrafluoroethylene)fluoropolymer (PETFE), and poly(methyl methacrylate) and various acrylate/methacrylate copolymers (PMMA). Suitable plastics for use as binder may also include various cyclic polyolefins, ARTON fabricated by JSR Corporation, Zeonor made by Zeon Chemicals L. P., and Topas made by Celanese A G. Other lower-temperature plastic substrates can also be used, including: ethylene-chlorotrifluoro ethylene (E-CTFE), marketed as HALAR from Ausimont U.S.A., Inc., ethylene-tetra-fluoroethylene (E-TFE) sold under the trademark TEFZEL by Dupont Corporation, polytetrafluoro-ethylene (PTFE), fiber glass enhanced plastic (FEP), and high density polyethylene (HDPE). Plastics that allow melting and undergo reflow at high temperatures can be particularly advantageous for their "self-laminating" capabilities.

Heat and pressure provide one type of lamination energy for bonding. Other lamination methods may use heat alone, pressure alone, or solvents or other materials with binder material.

Methods other than mechanical release can be used to loosen bonding layer 26. Energy for delamination can be provided by laser energy, using solvent-based release or other chemical agents, using heat, cooling, vibration, radiation, electromagnetic energy or other mechanisms.

Metal Foil Substrate 30

In one embodiment Alloy42 is used for metal foil substrate 30. The CTE of Alloy42 matches closely the CTE of types of glass typically employed in circuit fabrication, such as Eagle 2000. Using 5 mil (127 um) Alloy42 in combination with 500 um Eagle 2000 glass and a 1 mil (25 um) thick FEP bonding sheet yields a laminated stack 652 um thick which is in the focusing range of fabrication equipment set up for using 675 to 700 um glass used in many facilities. It is advantageous to provide a CTE match that is as close as possible between substrate 30, bonding layer 26, and carrier 24. In practice, the CTE match of bonding layer 26 is somewhat less significant where this layer is sufficiently thin so that any mismatch causes no measurable warping.

Magnetic Hold-down for Non-Magnetic Substrates

Another embodiment of the present invention uses magnetic hold-down clamping for non-magnetic substrates or for magnetic substrates with relatively low permeability. These may include low-permeability metals that exhibit very poor magnetic properties or other materials such as plastics, for example. For such materials, a magnetic clamping foil is used to sandwich the substrate against its carrier during lamination fusing.

Figure 6:
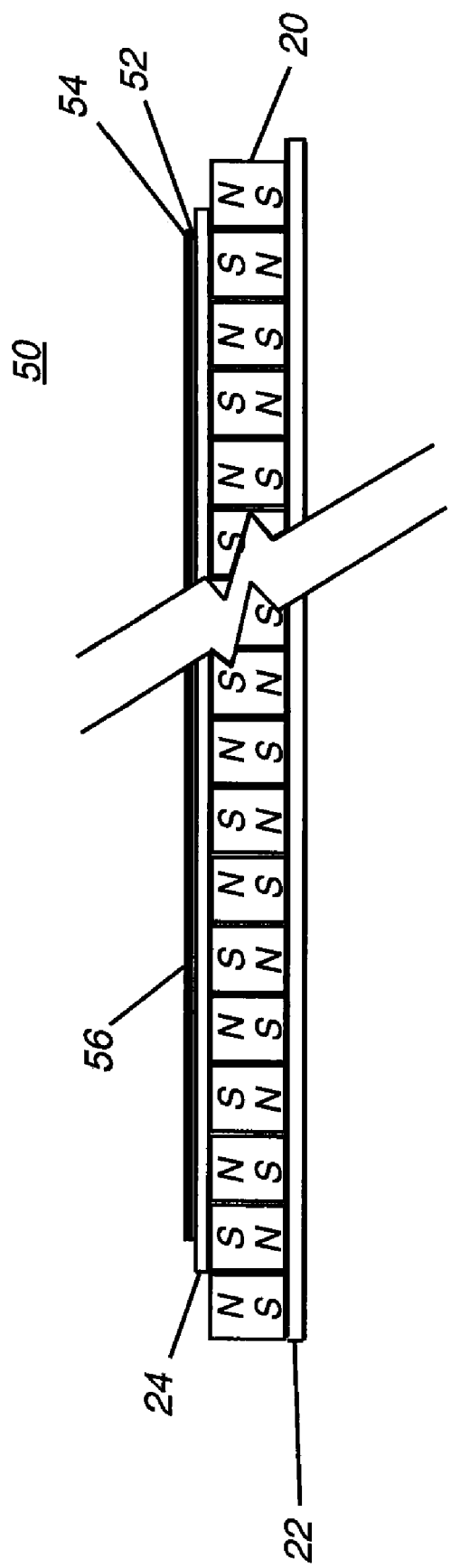
FIG. 6 is a cross-sectional side view showing a substrate package that employs a clamping foil in an alternate embodiment.

The side view diagram of FIG. 6 shows a substrate package 50 that is used for a non-magnetic or low-permeability substrate 52. As with the embodiment of FIG. 1A, magnets 20 are arrayed onto flux plate 22. Carrier 24 is similarly applied atop magnets 20, with overlaid bonding layer 26. Substrate 52 is positioned on top of bonding layer 26. A clamping foil 56 of a high-permeability metal is then applied against a surface 54 of substrate 52, cooperating with magnets 20 to provide a downward pressure between substrate 52 and its carrier 24. This helps to squeeze out any unwanted air pockets.

The non-magnetic or low-permeability substrate embodiment of FIG. 6 allows the use of a thicker sheet of metal for clamping foil 56. This embodiment offers different options for trimming excess from the bonding layer 26 sheet. With a metal substrate 52, clamping foil 56 can be slightly undersized to allow the edge of substrate 52 to serve as a guide for trimming. With a plastic substrate 52, the edge of clamping foil 56 itself is used as a trimming guide. Similar materials requirements as those given for the embodiment of FIGS. 1A-1D also apply when using the non-magnetic or low-permeability substrate of FIG. 6. Procedures for lamination fusing are also similar to those described earlier. Advantageously, clamping foil 56 covers surface 54 during fusing, thereby relaxing some of the cleanliness requirements for the lamination fusing environment.

Delamination Process Details

In one embodiment, delamination is performed at room temperature. For such an embodiment, adhesive material formulation and device fabrication temperatures are used that leave the adhesive in suitable condition for damage-free peeling. Using FEP, for example, the foil substrate and FEP layers can be cleanly peeled from the glass substrate.

If, however, excessive processing temperatures are used, FEP adhesive properties may exceed levels at which cold peeling is possible. In such a case, the wafer assembly must be heated to the softening point in order to skive the foil substrate from the glass carrier without deforming the foil substrate and damaging the components formed thereon. This can also leave a roughened surface, due to FEP that clings to the metal foil, necessitating additional cleaning steps.

The embodiments described herein have been directed primarily to describing single-sheet foil substrate processing using a magnetic platen. It should be pointed out that these process steps can be adapted to circuit fabrication on a larger scale, such as for use with automated equipment. This can include, for example, the use of web-based manufacturing, in which one or more of substrate 30, bonding layer 26, and carrier 24 can be fed from a roll.

The invention has been described in detail with particular reference to a presently preferred embodiment, but it will be understood that variations and modifications can be effected within the spirit and scope of the invention. The presently disclosed embodiments are therefore considered in all respects to be illustrative and not restrictive. The scope of the invention is indicated by the appended claims, and all changes that come within the meaning and range of equivalents thereof are intended to be embraced therein.

PARTS LIST

20. Magnet
22. Flux plate
24. Carrier
26. Bonding layer
28. Port
30. Substrate
32. Surface
36. Magnetic platen
38. Nozzle
40. Substrate package
42. Fused wafer stack
44. Tool
46. Electronic circuit
48. Push tool
50. Substrate package
52. Substrate
54. Surface
56. Clamping foil
58. Standoff
60. Air flotation fixture
62. Table
66. Cutout
68. Blade
70. Air nozzle apparatus
72. Magnet
74. Flux plate
76. Edge stop
78. Port
82. Air holes
A+, A−. Arrow
E. Enlarged area
F. Force

What is claimed is:

1. A method for forming an electronic circuit comprising:
    disposing a plurality of magnets onto a flux plate to form a magnetic platen;
    forming a substrate package comprising the magnetic platen and, stacked against the magnetic platen, a non-magnetic carrier and a substrate layer or the non-magnetic carrier, the substrate layer and a clamping layer of a magnetic material, with a bonding material sandwiched between the carrier and the substrate layer, and with the carrier layer disposed nearest the magnetic platen;
    forming a fused wafer stack by heating the substrate package to adhere the substrate layer to the carrier, wherein the magnetic platen provides a magnetic attraction between the substrate layer or the clamping layer and the magnetic platen while the fused wafer stack is formed;
    removing the fused wafer stack from the magnetic platen; and
    fabricating the circuit on the substrate layer.

2. The method of claim 1 wherein the substrate layer is a magnetic material.

3. The method of claim 1 wherein the substrate layer is a metal foil.

4. The method of claim 1 wherein forming the substrate package further comprises disposing a clamping foil of a magnetic material as the clamping layer against the substrate layer.

5. The method of claim 4 wherein the substrate layer is plastic.

6. The method of claim 1 wherein the non-magnetic carrier is glass.

7. The method of claim 1 further comprising delaminating the substrate layer from the carrier.

8. The method of claim 1 wherein forming the substrate package further comprises sliding the carrier along the magnetic platen while directing a flow of compressed air through one or more ports provided in the flux plate.

9. The method of claim 8 wherein directing the flow of compressed air further comprises providing an air nozzle having a magnetic coupling to the flux plate.

10. The method of claim 1 wherein removing the fused wafer stack from the magnetic platen comprises directing compressed air between the fused wafer stack and the magnetic platen.

11. The method of claim 1 wherein the bonding material is in sheet form.

12. A method for forming an electronic circuit comprising:
    forming a magnetic platen by magnetizing a magnetic material;
    forming a substrate package comprising the magnetic platen and, stacked against the magnetic platen, a non-magnetic carrier and a substrate layer or the non-magnetic carrier, the substrate layer and a clamping layer of a magnetic material, with a bonding material sandwiched between the carrier and the substrate layer, and with the carrier layer disposed nearest the magnetic platen;
    forming a fused wafer stack by heating the substrate package to adhere the substrate layer to the carrier, wherein the magnetic platen provides a magnetic attraction between the substrate layer or the clamping layer and the magnetic platen while the fused wafer stack is formed;
    removing the fused wafer stack from the magnetic platen; and
    fabricating the circuit on the substrate layer.

* * * * *